US007907411B2

(12) United States Patent
Whittum et al.

(10) Patent No.: US 7,907,411 B2
(45) Date of Patent: Mar. 15, 2011

(54) HEAT SINK ASSEMBLY HAVING INTERDIGITATED COOLING FINS

(75) Inventors: Mark L. Whittum, Cambridge, MA (US); Christopher W. Helmke, Bedford, NH (US)

(73) Assignee: Goodrich Corporation, Charlotte, NC (US)

( * ) Notice: Subject to any disclaimer, the term of this patent is extended or adjusted under 35 U.S.C. 154(b) by 143 days.

(21) Appl. No.: 12/315,381

(22) Filed: Dec. 3, 2008

(65) Prior Publication Data
US 2010/0134981 A1    Jun. 3, 2010

(51) Int. Cl.
H02K 7/20      (2006.01)
F28F 7/00      (2006.01)
G03B 17/00     (2006.01)
(52) U.S. Cl. .......... 361/710; 361/679.54; 361/704; 361/709; 361/716; 165/80.3; 165/185
(58) Field of Classification Search ........ 361/679.47–679.49, 679.54, 694–695, 361/697, 702–704, 709–710, 715–716; 165/80.2–80.5, 195, 185; 174/16.1, 16.3; 396/427, 429
See application file for complete search history.

(56) References Cited

U.S. PATENT DOCUMENTS

| 4,557,225 A * | 12/1985 | Sagues et al. ............ 123/41.31 |
| 5,930,113 A * | 7/1999 | McCann ..................... 361/704 |
| 6,735,082 B2 * | 5/2004 | Self ........................... 361/703 |
| 7,082,032 B1 * | 7/2006 | Barsun et al. ............... 361/703 |
| 7,333,332 B2 | 2/2008 | Wang |
| 7,447,020 B2 | 11/2008 | Xia et al. |
| 7,515,412 B2 * | 4/2009 | Lee ............................. 361/695 |

* cited by examiner

Primary Examiner — Robert J Hoffberg
(74) Attorney, Agent, or Firm — Scott D. Wofsy; Edwards Angell Palmer & Dodge LLP (57) ABSTRACT

A heat sink assembly including a first heat sink sub-assembly in thermal contact with a first heat source and including spaced apart columns of spaced horizontal fins extending outwardly from the first heat source, and a second heat sink sub-assembly in thermal contact with a second heat source and including spaced apart rows of space vertical fins extending outwardly from the second heat source, wherein the spaced apart columns of spaced horizontal and the spaced apart rows of spaced vertical fins are arranged in an interdigitated manner.

16 Claims, 6 Drawing Sheets

HEAT SINK ASSEMBLY HAVING INTERDIGITATED COOLING FINS

GOVERNMENT RIGHTS STATEMENT

The U.S. Government has a paid-up license in this invention and the right in limited circumstances to require the patent owner to license others on reasonable terms as provided for by the terms of FA8527-06-C-0008, awarded by the Air Force.

BACKGROUND OF THE INVENTION

1. Field of the Invention

The subject invention is directed to a heat sink assembly, and more particularly, to a compact heat sink assembly for preventing the heating of two distinct heat sources that are located in close proximity to one another within a device enclosure.

2. Description of Related Art

A heat sink is an environment or object that absorbs and dissipates heat from another object using thermal contact (either direct or radiant). Heat sinks are used in a wide range of applications, wherever efficient heat dissipation is required. Major examples include refrigeration, heat engines, cooling electronic devices and lasers.

Heat sinks function by efficiently transferring thermal energy ("heat") from an object at a relatively high temperature to a second object at a lower temperature with a much greater heat capacity. This rapid transfer of thermal energy quickly brings the first object into thermal equilibrium with the second, lowering the temperature of the first object, and thereby fulfilling the heat sink's role as a cooling device. Efficient function of a heat sink relies on the rapid transfer of thermal energy from the first object to the heat sink, and the heat sink to the second object.

The most common design of a heat sink is a metal device with many fins, as disclosed for example in U.S. Pat. No. 7,447,020 to Xia et al. The high thermal conductivity of the metal combined with its large surface area due to the fins result in the rapid transfer of thermal energy to the surrounding cooler air. This cools the heat sink and whatever it is in direct thermal contact with. A fan-based forced air system may improve the transfer of thermal energy from the heat sink to the surrounding air by moving cooler air between the fins, as disclosed for example in U.S. Pat. No. 7,333,332 to Wang.

Heat sinks are typically made from a good thermal conductor such as copper or aluminum alloy. Copper is significantly heavier and more expensive than aluminum but is also roughly twice as efficient as a thermal conductor. Aluminum has the significant advantage that it can be easily formed by extrusion, thus making complex cross-sections possible. The heat sink contact surface (i.e., the base) must be flat and smooth to ensure the best thermal contact with the object needing cooling. Further, a clamping mechanism, screws, or thermal adhesive typically holds the heat sink tightly onto the component to maximize thermal conductivity.

SUMMARY OF THE INVENTION

The subject invention is directed to a new and useful heat sink assembly for efficiently cooling two separate and distinct heat sources located in close proximity to one another within a common enclosure. More particularly, the heat sink assembly of the subject invention includes a first heat sink sub-assembly in thermal contact with a first heat source. The first heat sink sub-assembly includes at least first and second spaced apart banks of spaced horizontal cooling fins that extend outwardly from the first heat source. The assembly further includes a second heat sink sub-assembly in thermal contact with a second heat source. The second heat sink sub-assembly includes at least first and second spaced apart banks of spaced vertical cooling fins extending outwardly from the second heat source. The spaced apart banks of horizontal and vertical cooling fins are arranged in an interdigitated manner within a common enclosure.

Preferably, each bank of spaced horizontal cooling fins includes a column of spaced apart generally rectangular horizontal cooling fins, and each bank of spaced vertical cooling fins includes a row of spaced apart generally rectangular vertical cooling fins. In a preferred embodiment of the subject invention, the first heat sink sub-assembly includes three spaced apart banks of spaced horizontal cooling fins and the second heat sink sub-assembly includes four spaced apart banks of spaced vertical cooling fins. Other embodiments or arrangements having a greater or lesser number of interdigitated fin banks are also envisioned and well within the scope of the subject disclosure.

In an exemplary embodiment of the subject invention, each cooling fin has a thickness of about 0.03 inches, adjacent cooling fins in a particular bank of spaced cooling fins are separated from one another by a gap of about 0.07 inches, and adjacent banks of spaced cooling fins are separated from one another by a gap of about 0.05 inches.

The heat sink assembly of the subject invention further includes a housing defining an enclosure for the first and second heat sink sub-assemblies. The housing includes inlet means for permitting the ingress of air into the enclosure and outlet means for permitting the egress of air from the enclosure. At least one cooling fan communicates with the outlet means of the housing for drawing cooling air through the enclosure to rapidly transfer thermal energy from the heat sink sub-assemblies. In an embodiment of the subject invention, the first heat source is a compressor and the second heat source is an electronics module.

These and other features of the novel heat sink assembly of the subject invention will become more readily apparent to those having ordinary skill in the art from the following detailed description of the invention taken in conjunction with the several drawings described below.

BRIEF DESCRIPTION OF THE DRAWINGS

So that those skilled in the art to which the subject invention appertains will readily understand how to make and use the novel heat sink assembly of the subject invention without undue experimentation, preferred embodiments thereof will be described in detail below with reference to certain figures, wherein.

DESCRIPTION OF THE PREFERRED EMBODIMENTS

Figure 1:
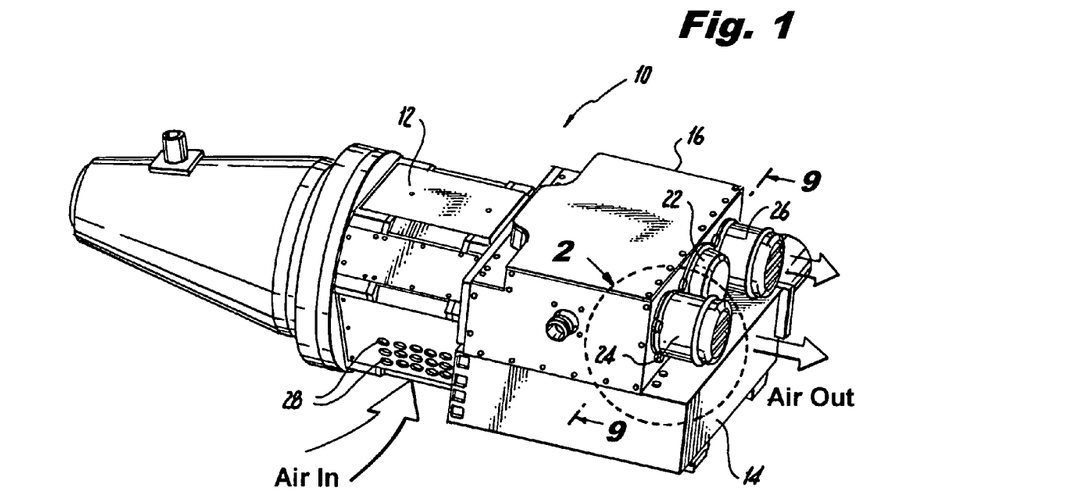
FIG. 1 is perspective view of an airborne infrared imaging camera assembly that houses two separate heat sources in the form of a compressor for cryogenically cooling the camera and an electronics module for controlling the camera, together with the heat sink assembly of the subject invention.

Referring now to the drawings wherein like reference numerals identify similar structural features or elements of the subject invention, there is illustrated in FIG. 1 an airborne infrared imaging camera assembly 10 which incorporates the novel heat sink assembly of the subject invention. At the onset, it should be understood that the heat sink assembly of the subject invention is not limited to being used with an airborne infrared imaging camera. Rather, the imaging camera described herein is merely an enabling example of a device with which the heat sink assembly of the subject invention may be employed to efficiently cool two separate and distinct heat sources located in close proximity to one another within an enclosure.

Figure 2:
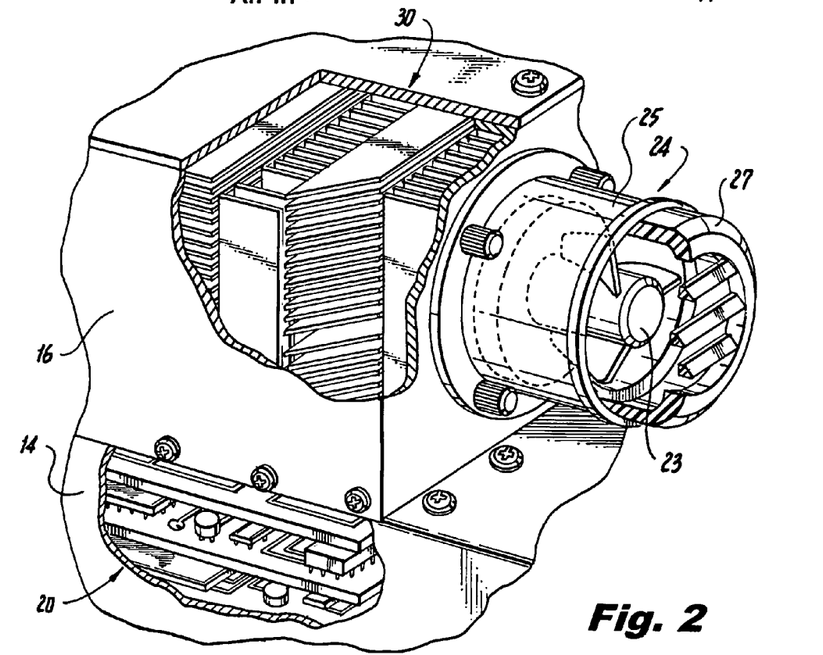
FIG. 2 is a localized view of the housing that encloses the heat sink assembly of the subject invention, with a section of the housing wall broken away to show four interdigitated banks of horizontal and vertical cooling fins, and wherein a section of the wall of the lower housing is broken away to show portions of the electronics module located therein, and wherein a section of the fan shroud is broken away to show the fan which draws cooling air though the housing to rapidly transfer heat from the fins to cool the heat sources associated therewith.

Referring to FIG. 1, the imaging camera assembly 10 includes a main camera housing 12, a lower rear compartment 14 which houses an electronics module that controls the imaging camera and an upper rear compartment 16 which houses a compressor that cryogenically cools the imaging camera. The electronics module, which is designated generally by reference numeral 20, is illustrated in FIG. 2. It basically includes a number of tiered circuit boards each having a plurality of powered electronic components that generate heat. Thus, the electronics module 20 constitutes a first heat source that must be cooled by the heat sink assembly 30 of the subject invention, which is described in greater detail below with reference to FIG. 3. The compressor, which is designated generally by reference numeral 22, constitutes a second heat source in close proximity to the electronics module 20. It must also be cooled by the heat sink assembly 30. Effectively dissipating heat generated by the compressor 22 serves to protect the compressor itself as well as the adjacent electronics module 20.

As best seen in FIGS. 1 and 2, cooling fan modules 24 and 26 are operatively associated with the upper rear compartment 16 of imaging camera 10. Each cooling fan module 24, 26 includes a fan element 23, a protective shroud 25 that surrounds the fan element 23 and a louvered exit cap 27. When the imaging camera 10 is in use, the fan elements 23 of fan modules 24 and 26 draw air into the main camera housing 12 through a series of inlet ports 28 formed in the side wall of the camera housing 12. Cooling air drawn into the camera housing 12 is ducted through a communication passage 15 into the upper compartment 16, across the interdigitated cooling fins of heat sink assembly 30, and out through the louvered exit caps 27 of the two fan modules 24 and 26.

Figure 3:
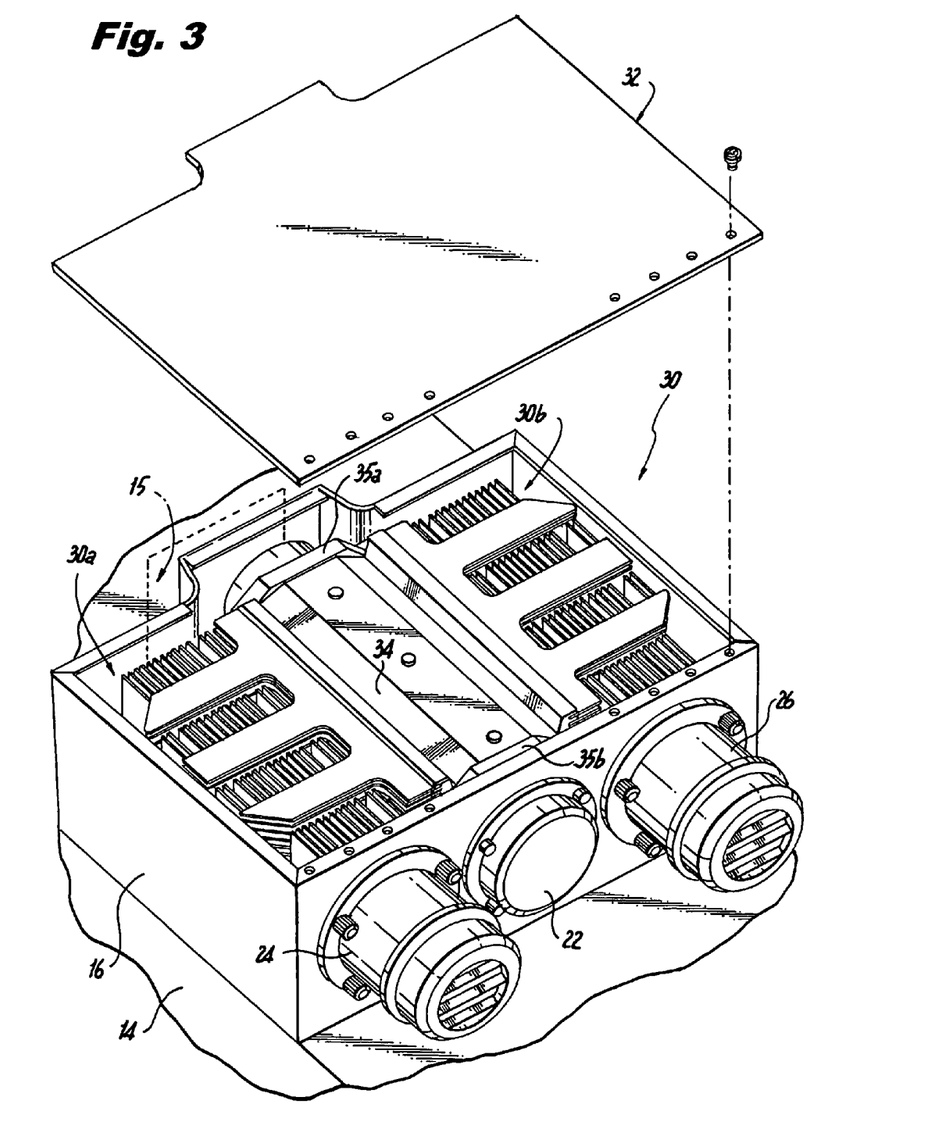
FIG. 3 is a perspective view of the interior of the enclosure which houses the heat sink assembly of the subject invention, which includes interdigitated banks of cooling fins symmetrically disposed on either side of the compressor casing.

Referring now to FIG. 3, removal of the threadably fastened cover 32 of the upper rear compartment 16 of imaging camera 10 provides access to heat sink assembly 30 of the subject invention. Access is also provided to the central casing 34 that houses the compressor 22 between front and rear end plates 35a and 35b. Heat sink assembly 30 includes a left heat sink assembly 30a and a right heat sink assembly 30b, which are symmetrically disposed about the compressor casing 34. The right and left heat sink assemblies 30a and 30b are identical to one another in terms of structure and function, and therefore, for purposes of brevity, only the left heat sink assembly 30a will be referred to in the detailed description which follows herein below.

Figure 4:
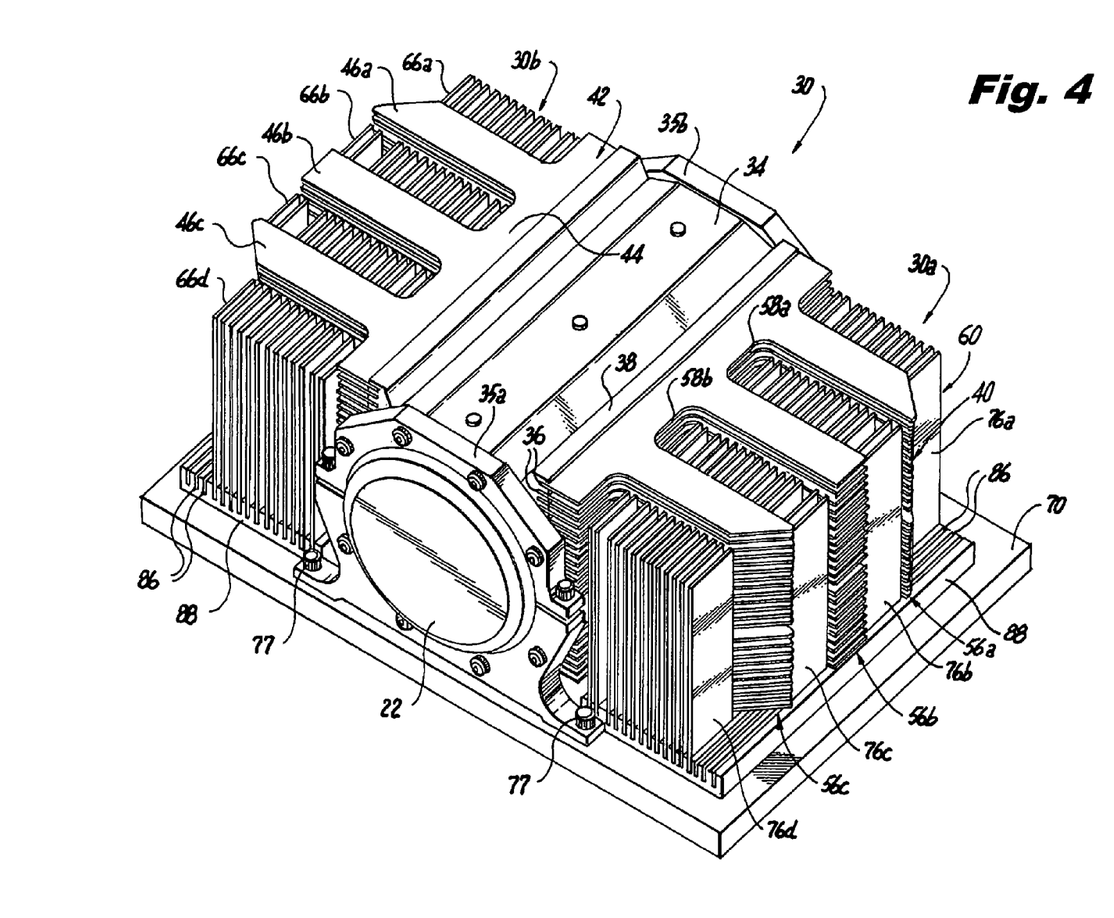
FIG. 4 is a perspective view of the heat sink assembly of the subject invention, removed from the enclosure shown in FIG. 3, illustrating the two heat sink sub-assemblies supported on a floor plate and symmetrically disposed on both sides of the compressor casing.

Referring now to FIG. 4, the left heat sink assembly 30a is formed by two interdigitated heat sink sub-assemblies. These include a first heat sink sub-assembly 40 and a second heat sink sub-assembly 60. the first heat sink sub-assembly 40 is formed by a plurality of horizontally spaced part, substantially planar heat dissipation elements 42, one of which is shown for example in FIG. 7. The second heat sink sub-assembly 60 formed by a plurality of vertically spaced part, substantially planar heat dissipation elements 62, one of which is shown for example in FIG. 8.

The heat dissipation elements 42 of the first heat sink sub-assembly 40 are in thermal contact with the compressor casing 34. These vertically spaced apart structural elements are adapted and configured to efficiently dissipate heat that is generated by the compressor 22. The heat dissipation elements 62 of the second heat sink sub-assembly 60 are in thermal contact with a planar floor plate 70 that separates the upper rear compartment 16 from the lower rear compartment 14. These horizontally spaced apart structural elements are adapted and configured to efficiently dissipate heat that is generated by the electronics module 20. As best seen in FIG. 4, the end plates 35a and 35b associated with compressor casing 34 are secured to floor plate 70 by fasteners 77.

Figure 7:
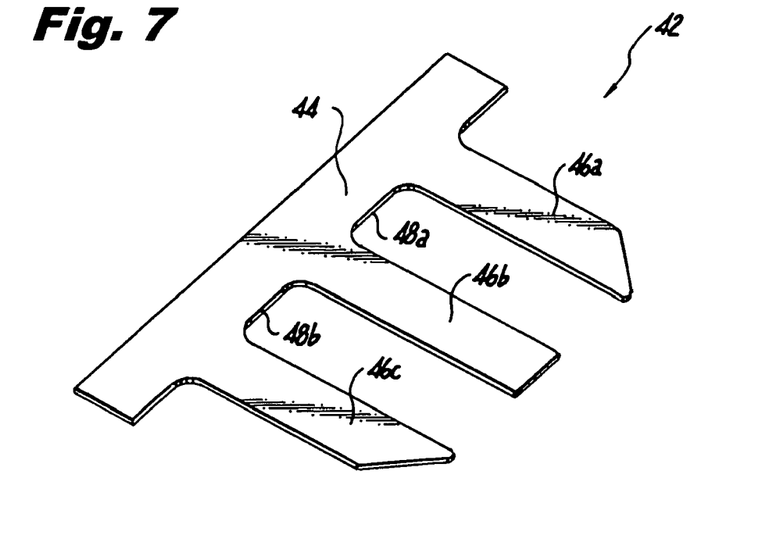
FIG. 7 is a perspective view of a horizontal cooling fin structure which forms part of a horizontal heat sink sub-assembly shown in FIGS. 3 and 4.

Referring to FIG. 7, each heat dissipation element 42 of heat sink sub-assembly 40 includes an elongated bridge portion 44, which forms the base of the structure. The bridge section 44 also serves as the primary heat transfer element in contact with the compressor casing 34. More particularly, the bridge portion 44 of each heat dissipation element 42 is engaged within a horizontal mounting channel 36 formed in the exterior side wall 38 of the compressor casing 34. Three spaced apart cooling fins extend outwardly from the bridge portion 44. These include a front cooling fin 46a, a medial cooling fin 46b and a rear cooling fin 46c. The front and rear cooling fins 46a and 46c are equidistantly spaced from the opposite ends of bridge section 44. A first slot 48a is formed between the front cooling fin 46a and the medial cooling fin 46b, and a second slot 48b is formed between the rear cooling fin 46c and the medial cooling fin 46b.

When the plurality of heat dissipation elements 42 of heat sink sub-assembly 40 are arranged or otherwise mounted in a horizontally spaced apart manner, as shown in FIG. 4, three spaced apart banks or columns of spaced horizontal cooling fins are constructed. These three columns include a front bank of spaced horizontal cooling fins 56a, a medial bank of spaced horizontal cooling fins 56b and rear bank of spaced horizontal cooling fins 56c. In addition, two vertically extending bays are formed between adjacent banks of cooling fins, these include a first bay 58a defined between the front bank 56a and the medial bank 56b, and a second bay 58b defined between the rear bank 56c and the medial bank 56b.

Figure 5:
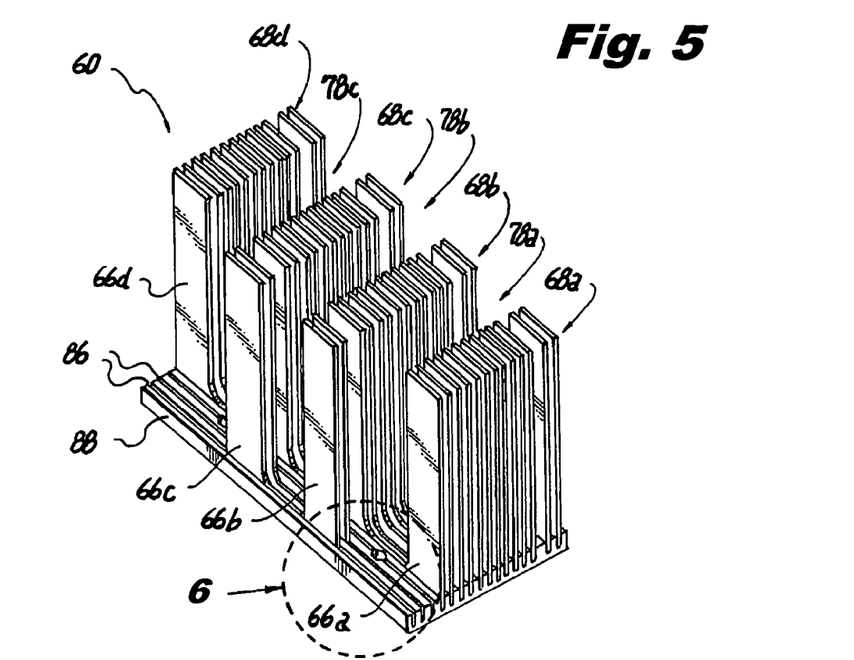
FIG. 5 is a perspective view of a heat sink sub-assembly that includes four spaced apart banks of spaced vertical cooling fins supported on a mounting plate.
Figure 6:
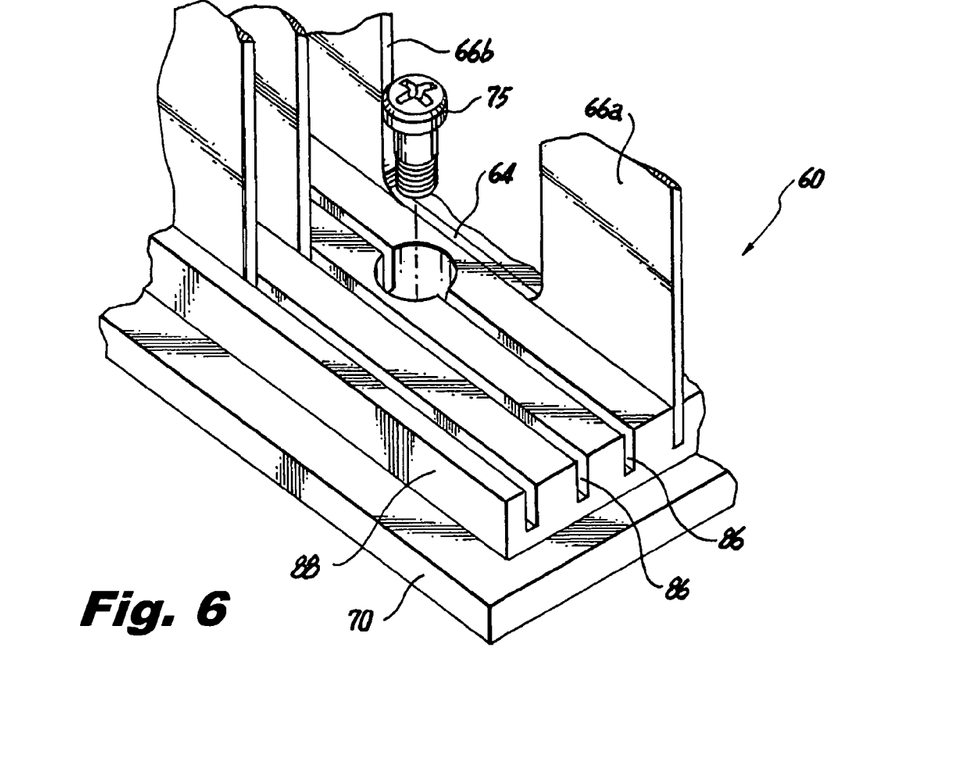
FIG. 6 is a localized perspective view of an area of the mounting plate shown in FIG. 5, illustrating one of the fasteners used to secure the mounting plate to the floor plate of the housing.
Figure 8:
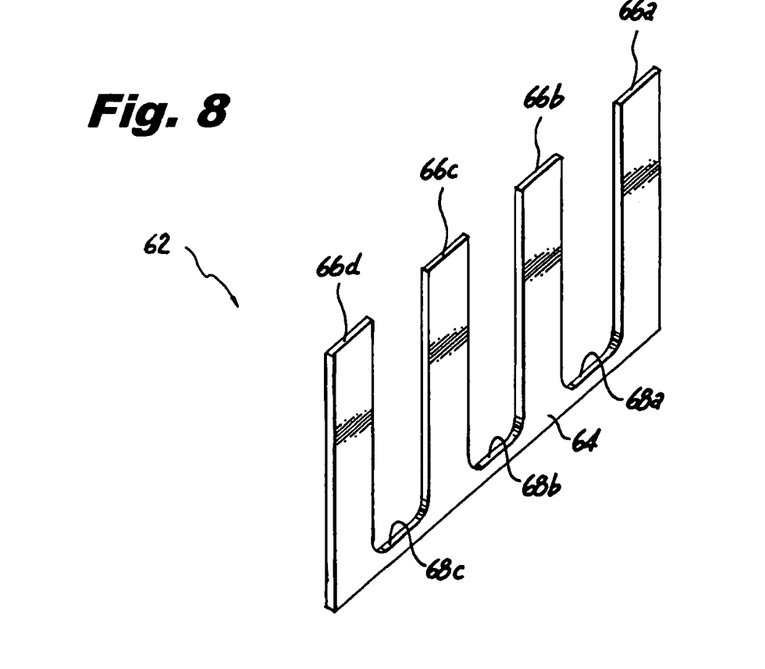
FIG. 8 is a perspective view of a vertical cooling fin structure which forms part of a vertical heat sink sub-assembly shown in FIGS. 3 and 4.

Referring to FIG. 8, each heat dissipation element 62 of the second heat sink sub-assembly 60 includes an elongated bridge section 64 which forms the base of the structure. The bridge section 64 also serves as the primary heat transfer element in contact with the floor plate 70 that separates the electronics module 20 within the lower compartment 14 from the compressor 20 within the upper compartment 16. More particularly, as best seen in FIG. 5, the bridge portion 64 of each heat dissipation element 62 is engaged or otherwise supported within a respective horizontal mounting channel 86 formed in a rectangular mounting plate 88. Mounting plate 88 is secured to the floor plate 70 by threaded fasteners 75, as shown in FIG. 6. Fasteners 75 tightly secure mounting plate 88 to floor plate 70 to maximize the thermal conductivity therebetween.

In most instances, four spaced apart cooling fins extend outwardly from the bridge portion 64 of the heat dissipation members 62 of sub-assembly 60. These include a first cooling fin 66a, a second cooling fin 66b, a third cooling fin 66c and a fourth cooling fin 66d. A first slot 68a is formed between the first cooling fin 66a and the second cooling fin 66b, a second slot 68b is formed between the second cooling fin 66b and the third cooling fin 66c, and a third slot 68c is formed between the third cooling fin 66c and the fourth cooling fin 66d. In some instances, to accommodate the overall geometry of the heat sink assembly 30a, the heat dissipation members 62 of sub-assembly 60 include only the two medial cooling fins 66b and 66c. Also, in sections of mounting plate 88, there are mounting slots 86 that do not contain a heat dissipation member at all. This is typically at a location which accommodates a mounting screw 75, as shown for example in FIG. 6.

When the plurality of heat dissipation elements 62 of heat sink sub-assembly 60 are arranged or otherwise mounted in a vertically spaced apart manner on mounting plate 70, as shown in FIGS. 4 and 5, four equidistantly spaced apart banks or rows of spaced vertical cooling fins are formed. These rows include a first bank of spaced vertical cooling fins 76a, a second bank of spaced vertical cooling fins 76b, a third bank of spaced vertical cooling fins 76c and a fourth bank of spaced vertical cooling fins 76d. In addition, three vertically extending bays are formed between adjacent banks of vertical cooling fins. These include a first bay 78a formed between the first and second banks of spaced vertical cooling fins 76a and 76b, a second bay 78b formed between the second and third banks of spaced vertical cooling fins 76b and 76c, and a third bay 78c formed between the third and fourth banks of spaced vertical cooling fins 76c and 76d, as best seen in FIG. 5.

Referring to FIGS. 4 and 5, when the two heat sink sub-assemblies 40 and 60 are assembled together the are arranged in an interdigitated manner. Thus, the front bank of spaced horizontal cooling fins 56a is disposed between the first bank of spaced vertical cooling fins 76a and the second bank of spaced vertical cooling fins 76b. The medial bank of spaced horizontal cooling fins 56b is disposed in between second bank of spaced vertical cooling fins 76b and the third bank of spaced vertical cooling fins 76c. The rear bank of spaced horizontal cooling fins 56c is disposed between the third bank of spaced vertical cooling fins 76c and the fourth bank of spaced vertical cooling fins 76d. Thus, all of the cooling fins of heat sink sub-assembly 40 are disposed orthogonal to all of the cooling fins of heat sink sub-assembly 60, which is best seen in FIG. 9.

Figure 9:
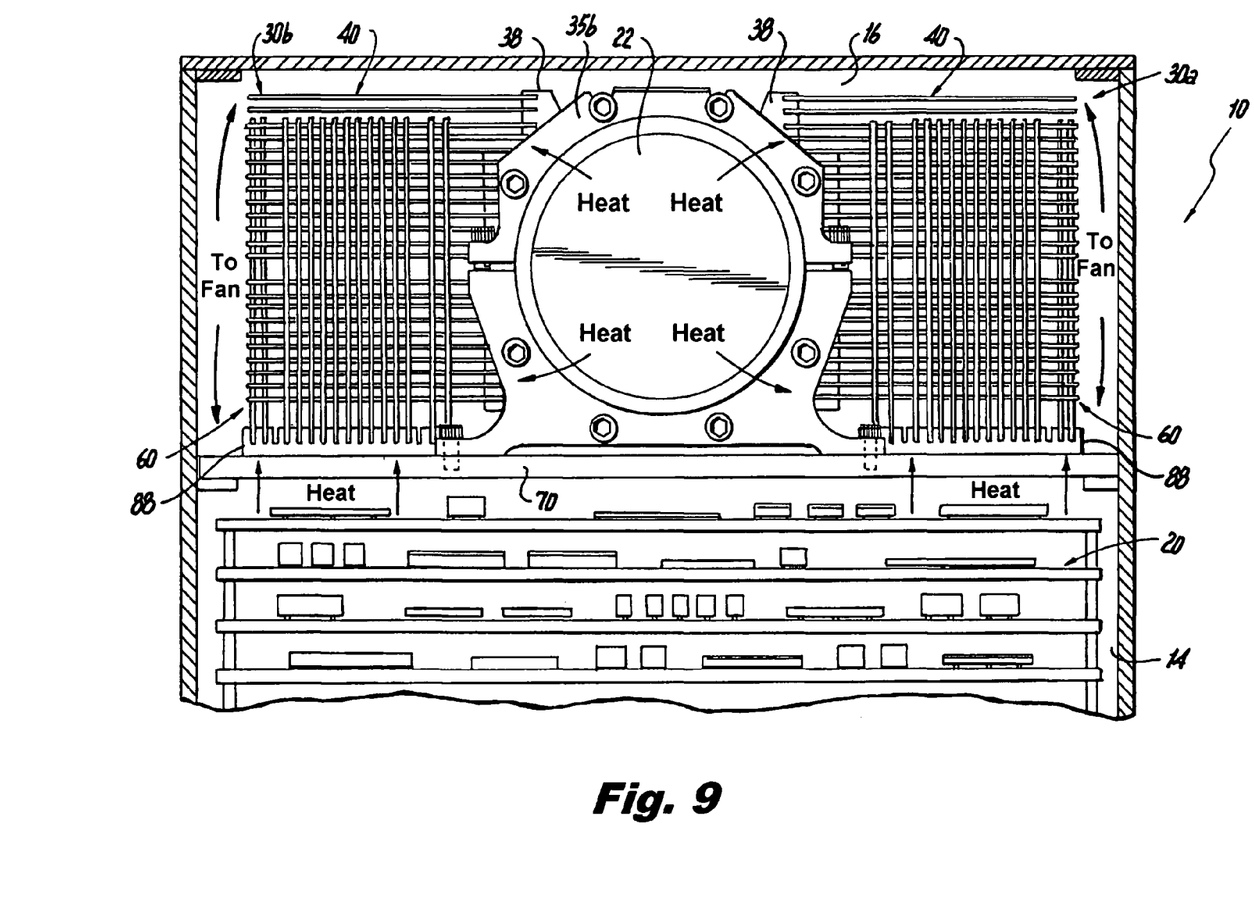
FIG. 9 is a cross-sectional view taken along line 9-9 of FIG. 1, illustrating the compressor casing, the multi-tiered circuit boards of the electronics module and the interdigitated cooling fins of the heat sink assembly for dissipating heat generated by the compressor and electronics module.

Referring to FIG. 9, during operation of the imaging camera 10, heat generated by the electronics module 20 in the lower compartment 14 is transferred through the floor plate 70 to the mounting plates 88, by direct thermal contact. Heat from the mounting plates 88 is then transferred to the spaced apart vertical banks of cooling fins that form heat sink sub-assembly 60. Similarly, heat generated by the compressor 22 in the upper compartment 16 is transferred through the side walls 38 of compressor casing 34. Heat from the side wall 38 of the compressor casing 34 is then transferred directly to the spaced part horizontal banks of cooling fins that form heat sink sub-assembly 40. At the same time, cooling air is drawn across the orthogonally arranged interdigitated cooling fins of the right and left heat sink assemblies 30a and 30b by respective cooling fan modules 24 and 26, to rapidly transfer the thermal energy therefrom, thus maintaining the electronics module and compressor at a safe operating temperature.

In an embodiment of the subject invention, each heat dissipating fin (horizontal or vertical) has a thickness of about 0.03 inches, adjacent fins in a particular bank of spaced fins (column or row) are separated from one another by a gap of about 0.07 inches, and adjacent banks of spaced fins (columns and rows) are separated from one another by a gap of about 0.05 inches. The cooling fins are preferably made from an effective thermal conductor such as, for example, copper or an aluminum alloy. While each of the cooling fins are shown and described herein as being generally rectangular in shape and substantially planar in profile. It is envisioned and well within the scope of the subject disclosure that the profile or angular pitch of the fins can be adjusted to obtain an acceptable pressure drop across the heat sink assembly with respect to the cooling air flow.

As a result of the interdigitated heat sink arrangement of the subject invention, the plural spaced apart columns of spaced horizontal cooling fins and the plural spaced apart rows of spaced vertical cooling fins have an equal share of the fan flow footprint within the upper compartment 16 of imaging camera assembly 10. Moreover, those skilled in the art will readily appreciate that the fin dimensions in the cooling air flow direction is relatively short, which will result in a higher amount of heat transfer.

While the subject invention has been shown and described with reference to preferred embodiments, those skilled in the art will readily appreciate that various changes and/or modifications may be made thereto without departing from the spirit and/or scope of the subject disclosure. For example, while the heat sink assembly of the subject invention has been shown and described with the first heat sink sub-assembly having three banks or columns of spaced horizontal fins and the second heat sink sub-assembly having four banks or rows of spaced vertical fins, those skilled in the art will readily appreciate that the number of vertical fin banks and horizontal fin banks will vary depending upon the size of the heat sources being cooled and the dimensions of the enclosure in which the heat sink sub-assemblies are housed.

It is further envisioned that the number of horizontal fin banks in the heat sink assembly can be equal to or different from the number of vertical fin banks in the heat sink assembly, as long as the fin banks are arranged in such a manner so as to have an equal share of the fan flow footprint. Indeed, it is envisioned that the heat sink assembly of the subject invention could simply include a first bank of spaced apart cooling fins in thermal contact with a first heat source and a second bank of spaced apart cooling fins in thermal contact with a second heat source, wherein the first and second banks are in close proximity to one another and the cooling fins of the first bank are oriented orthogonal to the cooling fins of the second bank.

Furthermore, while the heat sink assembly of the subject invention has been described and illustrated in connection with an airborne infrared imaging camera having two heat sources in the form of an electronics module and a compressor, it should be readily apparent to those skilled in the art that the interdigitated heat sink sub-assemblies disclosed herein can be employed in other devices in which there are two distinct heat sources that must be cooled within a relatively small spatial envelope. Indeed, the heat sink assembly of the subject invention can be employed with heat sources such as refrigeration units, heat engines, electric motors, vacuum pumps, lasers, amplifiers audio components, video components and other powered electronic devices.

What is claimed is:

1. A heat sink assembly comprising: a) a first heat sink sub-assembly in thermal contact with a top surface of a first heat source and including at least first and second spaced apart horizontal banks of spaced horizontal fins extending outwardly from the first heat source in a first plane; and b) a second heat sink sub-assembly in thermal contact with a lateral surface of a second heat source and including at least first and second spaced apart banks of vertical spaced vertical fins extending outwardly from the second heat source in a second plane that is orthogonal to the first plane, wherein the spaced apart banks of horizontal and vertical fins are arranged in an interdigitated manner and wherein adjacent horizontal and vertical banks of spaced fins are separated from one another by a gap.

2. A heat sink assembly as recited in claim 1, wherein each bank of horizontal fins includes a column of spaced apart generally rectangular horizontal fins.

3. A heat sink assembly as recited in claim 1, wherein each bank of vertical fins includes a row of spaced apart generally rectangular vertical fins.

4. A heat sink assembly as recited in claim 1, wherein the first heat sink sub-assembly includes three spaced apart banks of spaced horizontal fins.

5. A heat sink assembly as recited in claim 1, wherein the second heat sink sub-assembly includes four spaced apart banks of spaced vertical fins.

6. A heat sink assembly as recited in claim 1, further comprising a housing defining an enclosure for the first and second heat sink sub-assemblies.

7. A heat sink assembly as recited in claim 6, wherein the housing includes inlet means for permitting ingress of air into the enclosure.

8. A heat sink assembly as recited in claim 6, wherein the housing includes outlet means for permitting egress of air from the enclosure.

9. A heat sink assembly as recited in claim 8, wherein at least one cooling fan is in communication with the outlet means of the housing for drawing air from the enclosure.

10. A heat sink assembly as recited in claim 1, wherein the first heat source is a compressor.

11. A heat sink assembly as recited in claim 1, wherein the second heat source is an electronics module.

12. A heat sink assembly comprising: a) a first heat sink sub-assembly in thermal contact with a top surface of a first heat source and including spaced apart columns of spaced horizontal fins extending outwardly from the first heat source in a first plane; and b) a second heat sink sub-assembly in thermal contact with a lateral surface of a second heat source and including spaced apart rows of spaced vertical fins extending outwardly from the second heat source in a second plane oriented orthogonal to the first plane, wherein the spaced apart columns of spaced horizontal fins and the spaced apart rows of spaced vertical fins are arranged in an interdigitated manner and wherein adjacent columns of the spaced horizontal fins and rows of the spaced vertical fins are separated from one another by a gap.

13. A heat sink assembly as recited in claim 12, further comprising a housing defining an enclosure for the first and second heat sink sub-assemblies.

14. A heat sink assembly as recited in claim 13, wherein the housing includes inlet means for permitting ingress of air into the enclosure.

15. A heat sink assembly as recited in claim 13, wherein the housing includes outlet means for permitting egress of air from the enclosure.

16. A heat sink assembly as recited in claim 15, wherein at least one cooling fan is in communication with the outlet means of the housing for drawing air from the enclosure.

* * * * *